(12) United States Patent
Fujinuma

(10) Patent No.: US 7,774,170 B2
(45) Date of Patent: Aug. 10, 2010

(54) DESIGN/VERIFICATION AID SYSTEM AND DESIGN/VERIFICATION AID

(75) Inventor: Tomohisa Fujinuma, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 687 days.

(21) Appl. No.: 11/400,914

(22) Filed: Apr. 10, 2006

(65) Prior Publication Data
US 2006/0241800 A1  Oct. 26, 2006

(30) Foreign Application Priority Data
Apr. 26, 2005  (JP) .............................. 2005-128387

(51) Int. Cl.
*G06F 17/50* (2006.01)
*G06F 19/00* (2006.01)
(52) U.S. Cl. ............................. 703/1; 700/182; 700/97; 700/98; 715/964
(58) Field of Classification Search ...................... 703/1
See application file for complete search history.

(56) References Cited

U.S. PATENT DOCUMENTS 5,323,333 A * 6/1994 Johnson .......................... 703/1
6,754,556 B1 * 6/2004 Landers et al. .............. 700/182
6,944,513 B1 * 9/2005 Tomomitsu et al. ........... 700/98
2003/0078758 A1 * 4/2003 Hariya et al. ................... 703/2

FOREIGN PATENT DOCUMENTS

JP   2004-213297   7/2004

* cited by examiner

*Primary Examiner*—Dwin M Craig
(74) *Attorney, Agent, or Firm*—Blakely, Sokoloff, Taylor & Zafman LLP

(57) ABSTRACT

According to one embodiment, a design/verification aid system adapted to aid design of a product and verification of the design, includes a design processing unit that executes a CAD process, which includes a part generation process to generate a part geometric model, a part addition process to add a part geometric model corresponding to another part to generate a whole geometric model corresponding to a product under design, and a part movement process to move a position of a predetermined part geometric model, an analytic model generation unit that generates an analytic model corresponding to a part geometric model, an analytic model edition unit that edits the generated analytic model in accordance with a content of the part addition or movement process and generates a whole analytic model, and an analysis unit that executes an analysis process to analyze the whole geometric model and displays an analytic result.

8 Claims, 7 Drawing Sheets

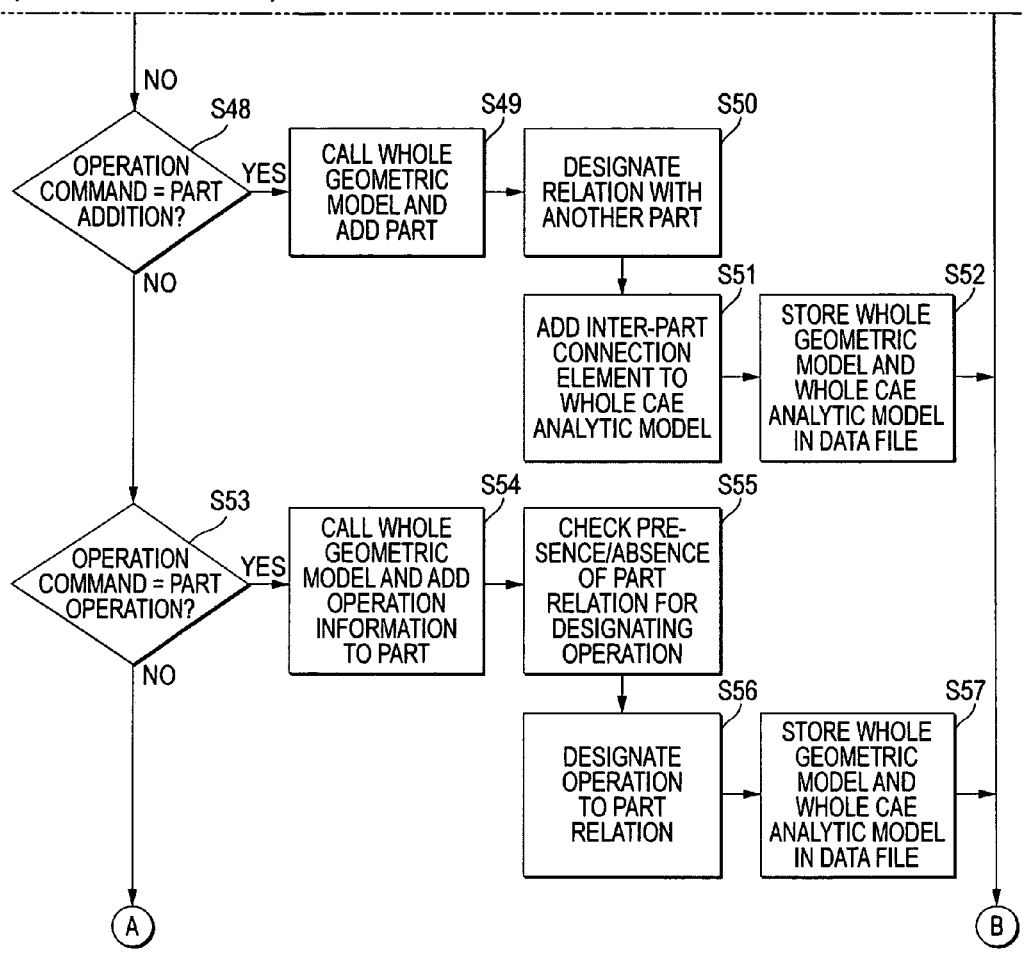

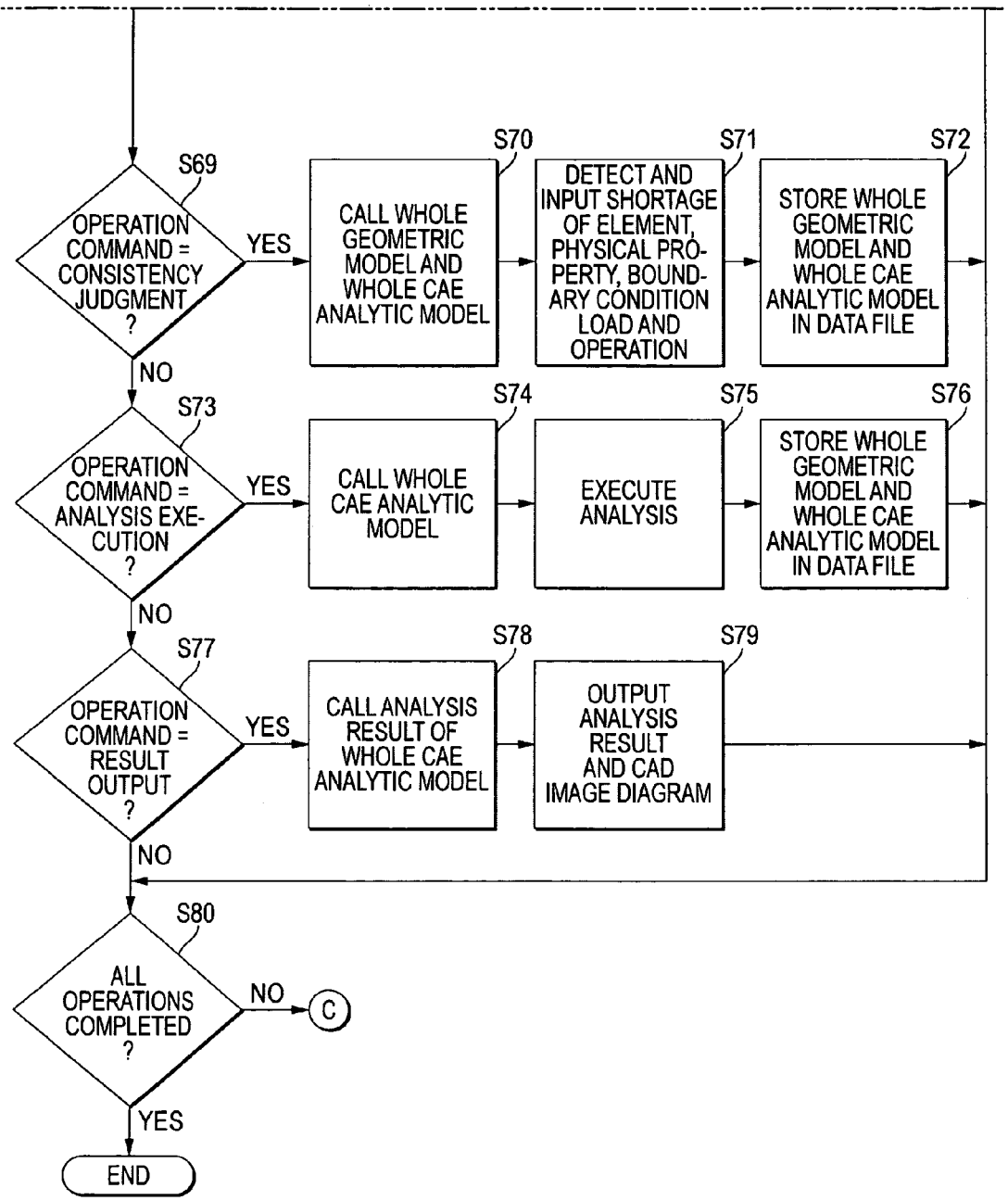
(FIG. 3 CONTINUED)

STRESS →

OUTPUT DATA (ANALYSIS RESULT)

OUTPUT DATA (CAD IMAGE DIAGRAM)

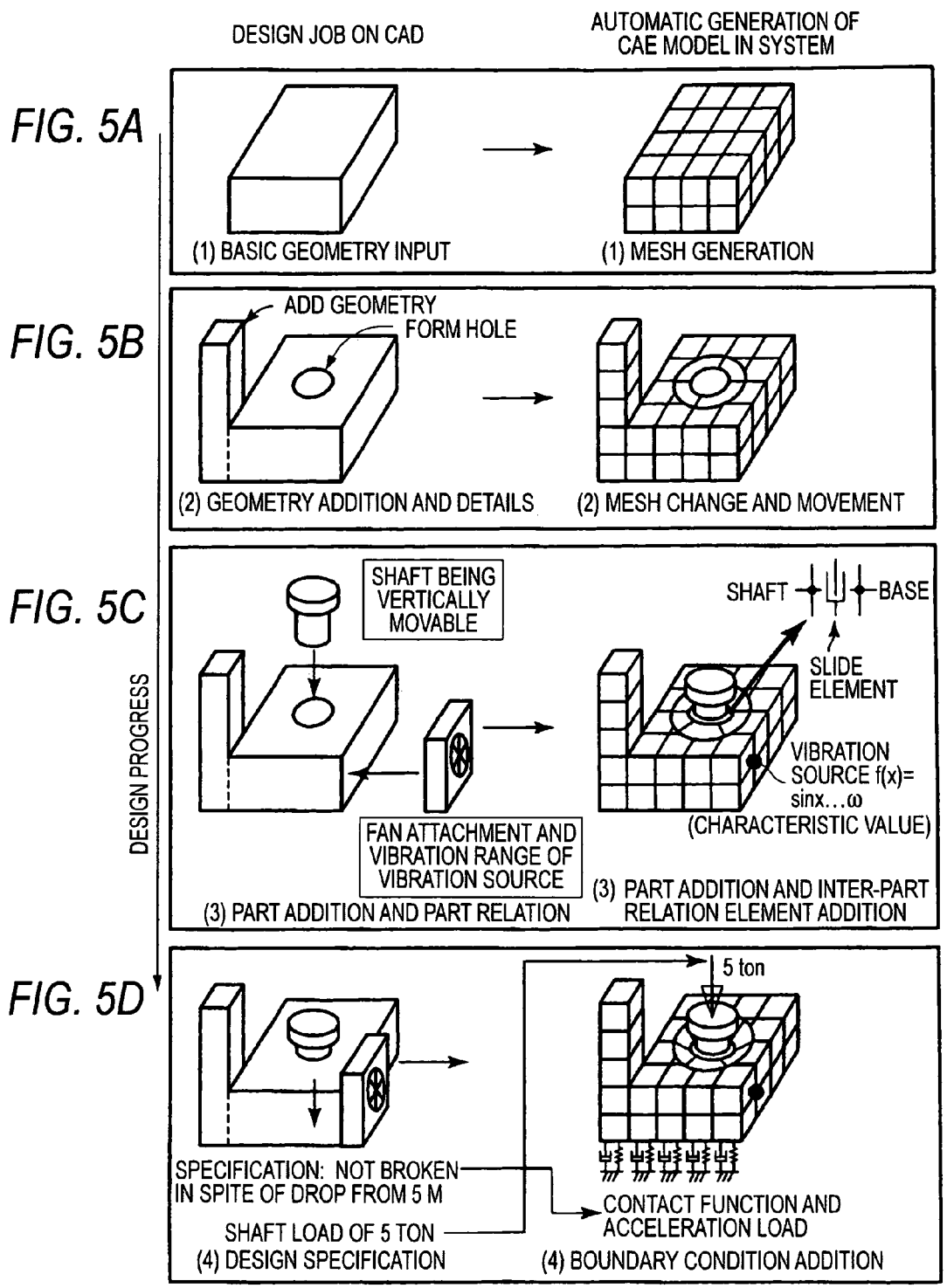

DESIGN/VERIFICATION AID SYSTEM AND DESIGN/VERIFICATION AID

CROSS-REFERENCE TO RELATED APPLICATIONS

This application is based upon and claims the benefit of priority from the prior Japanese Patent Applications No. 2005-128387, filed on Apr. 26, 2005; the entire contents of which are incorporated herein by reference.

BACKGROUND

1. Field

One embodiment of the invention relates to a design/verification aid system and a design/verification aid method for aiding design of a product and verification of the design.

2. Description of the Related Art

Various CAD (computer aided design) systems for aiding design of industrial products have been developed in recent years. This type CAD system can perform a design aid process corresponding to a product assembling job such as addition and movement of parts as well as it can aid a process of generating parts by using geometric models.

A CAE (computer aided engineering) system for verifying design data obtained by the CAD system has been also developed.

In the CAE system, there are executed a pre-process for generating analytic models from geometric models designed by the CAD system and an analysis process. In the pre-process, there are executed a process for calling an analyzable object range from each geometric model, a process for simplifying the geometry of the called geometric model, a process for dividing the simplified geometric model in the form of a mesh, and so on. In the analysis process, there is executed an analysis process for obtaining a stress distribution, a flow velocity distribution, etc. on the basis of the generated analytic models, the inputted boundary conditions, etc.

The CAD system and the CAE system are however usually independent of each other. For this reason, the CAE system needs to retry processing from the pre-process whenever a substantial change occurs in the design of the product, etc.

Moreover, the job of inputting boundary conditions, etc. necessary for analysis must be performed by an analyzing person per se because data sent from the CAD system to the CAE system are only data of geometric models.

It is disclosed by, for example JP-A-2004-213297, a CAD/CAE system having a CAD section and a CAE section cooperating with each other. In the CAD/CAE system, an analytic model corresponding to a geometric model generated by the CAD section is generated by the CAE section.

In the system disclosed in JP-A-2004-213297, however, the CAE section does not support the CAD process concerned with an assembling job such as addition and movement of parts because the CAE section only generates an analytic model corresponding to the geometric model generated by the CAD section. For this reason, the CAE section cannot cooperate with the CAD section any more if the assembling job such as addition and movement of parts is performed in the CAD section. Accordingly, after the CAD process concerned with the assembling job such as addition and movement of parts is performed, the CAD section needs to send all design data to the CAE section so that the CAE section can retry processing from the pre-process.

The invention is achieved under such circumstances. An object of the invention is to provide a design/verification aid system and a design/verification aid method which can rapidly verify design of a product in any design stage of the product.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIGS. 5A to 5D are exemplary views showing an example of an analytic model edition process in respective design stages in the design/verification aid system depicted in FIG. 1.

DETAILED DESCRIPTION

Various embodiments according to the invention will be described hereinafter with reference to the accompanying drawings. In general, according to one embodiment of the invention, a design/verification aid system for aiding design of a product and verification of the design includes a design processing unit that executes a CAD (computer aided design) process in accordance with an input operation command, the CAD process including a part generation process to generate a part geometric model, apart addition process to add to the generated part geometric model a part geometric model corresponding to another part to generate a whole geometric model corresponding to a product under design, and a part movement process to move a position of a predetermined part geometric model in the whole geometric model, an analytic model generation unit that, when a part geometric model is generated by the part generation process, generates an analytic model corresponding to the part geometric model, an analytic model edition unit that, whenever either of the part addition process and the part movement process is executed, edits the generated analytic model in accordance with a content of either of the part addition process and the part movement process, and generates a whole analytic model corresponding to the whole geometric model, and an analysis unit that executes an analysis process to analyze the whole geometric model on a basis of the whole analytic model generated by the analytic model edition unit, and displays an analytic result.

According to an embodiment, it is possible to rapidly verify design of a product in any design stage of the product.

Figure 1:
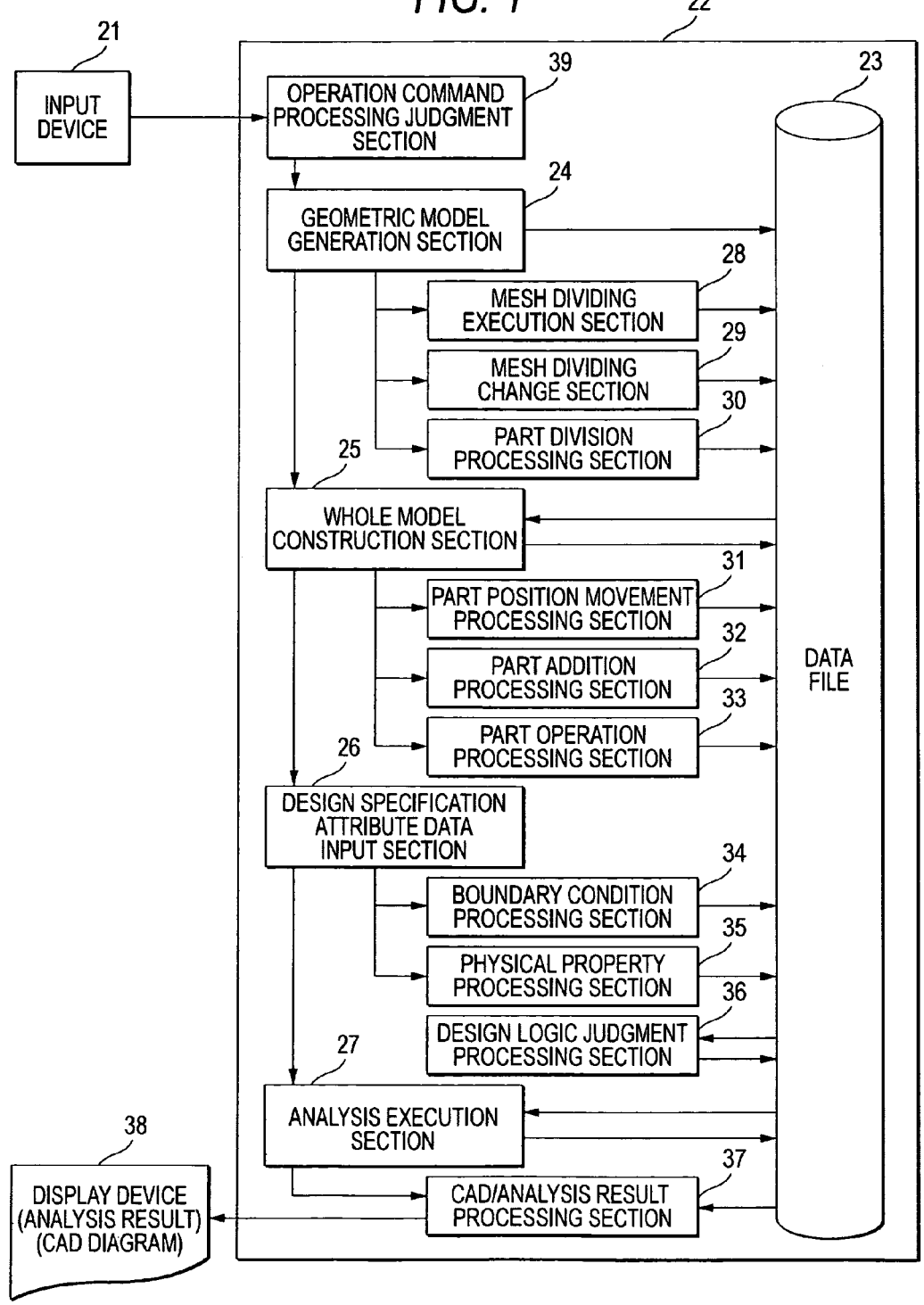
FIG. 1 is an exemplary block diagram showing the system configuration of a design/verification aid system according to an embodiment of the invention.

According to an embodiment, FIG. 1 shows an example of configuration of a design/verification aid system according to an embodiment of the invention. This design/verification aid system is a system which aids design of an industrial product and verification of the design and which is implemented by a computer. The design/verification aid system is provided with a CAD system for aiding design. A CAE system for aiding verification of the design is incorporated in the CAD system.

Accordingly, the design/verification aid system serves as a design progress correspondence CAD/CAE system by which a product to be currently designed by the CAD system can be verified and evaluated in any design stage.

The design/verification aid system includes an input device 21, a system body 22, and a display device 38. The system body 22 is a main processing section of the computer. The system body 22 is implemented by hardware such as a CPU, a memory, a disk storage device, etc. The system body 22 has a data file storage section 23, an operation command processing judgment section 39, a geometric model generation section 24, a mesh dividing execution section 28, a mesh dividing change section 29, a part division processing section 30, a whole model construction section 25, a part position movement processing section 31, a part addition processing section 32, a part operation processing section 33, a design specification attribute data input section 26, a boundary condition processing section 34, a physical property processing section 35, a design logic judgment processing section 36, an analysis execution section 27, and a CAD/analysis result processing section 37.

The input device 21 inputs various CAD operation commands into the system body 22. The operation command processing judgment section 39 executes a process for judging the kind of a CAD operation command inputted from the input device 21. The geometric model generation section 24 executes a part generation process for generating a part geometric model in accordance with a part generation command inputted from the input device 21. The geometric model generation section 24 also executes a geometry change process for changing the geometry of the part geometric model and a part division process for dividing the part geometric model into pieces in accordance with a part geometry change command and a part division command which are inputted from the input device 21.

Whenever a part geometric model is generated by the geometric model generation section 24, the mesh dividing execution section 28 divides the part geometric model into the form of a mesh to thereby generate an analytic model (CAE analytic model) corresponding to the part geometric model. When the geometry of the part geometric model is changed by the geometric model generation section 24, the mesh dividing change section 29 changes the analytic model in accordance with the change of the geometry of the part geometric model. When the geometric model generation section 24 divides the part geometric model into pieces, the part division processing section 30 divides the analytic model in accordance with the division of the part geometric model.

The whole model construction section 25 executes a part addition process for generating a whole geometric model corresponding to the product under design by adding a part geometric model corresponding to another part to the generated part geometric model in accordance with a part addition command inputted from the input device 21. The whole model construction section 25 also executes a part movement process for moving the position of a predetermined part geometric model in the whole geometric model in accordance with a part movement command inputted form the input device 21.

The part position movement processing section 31 and the part addition processing section 32 executes a process for generating a whole analytic model corresponding to the current whole geometric model by editing the analytic model in accordance with the contents of execution of the part addition process and the part movement process. The part operation processing section 33 also sets information about the operation of a part with respect to the whole geometric model in accordance with a part operation command inputted from the input device 21. The part operation processing section 33 also sets the information about the operation of the part with respect to the whole analytic model.

The design specification attribute data input section 26 executes a process for inputting attribute information for designating design specifications of the whole geometric model and a process for inputting attribute information for designating physical property of each part. The boundary condition processing section 34 executes a process for converting the inputted design specifications into boundary conditions for CAE analysis and setting the boundary conditions for the whole analytic model. The physical property processing section 35 executes a process for setting the input physical properties for the whole analytic model.

The design logic judgment processing section 36 judges whether conditions necessary for CAE analysis such as boundary conditions, physical properties, operations and loads are gathered or not. The analysis execution section 27 executes a CAE analysis process for analyzing the whole geometric model on the basis of the whole analytic model. The CAD/analysis result processing section 37 executes a process for displaying CAD design data (the part geometric models and the whole geometric model) and a CAE analysis processing result on the display device 38.

Figure 2:
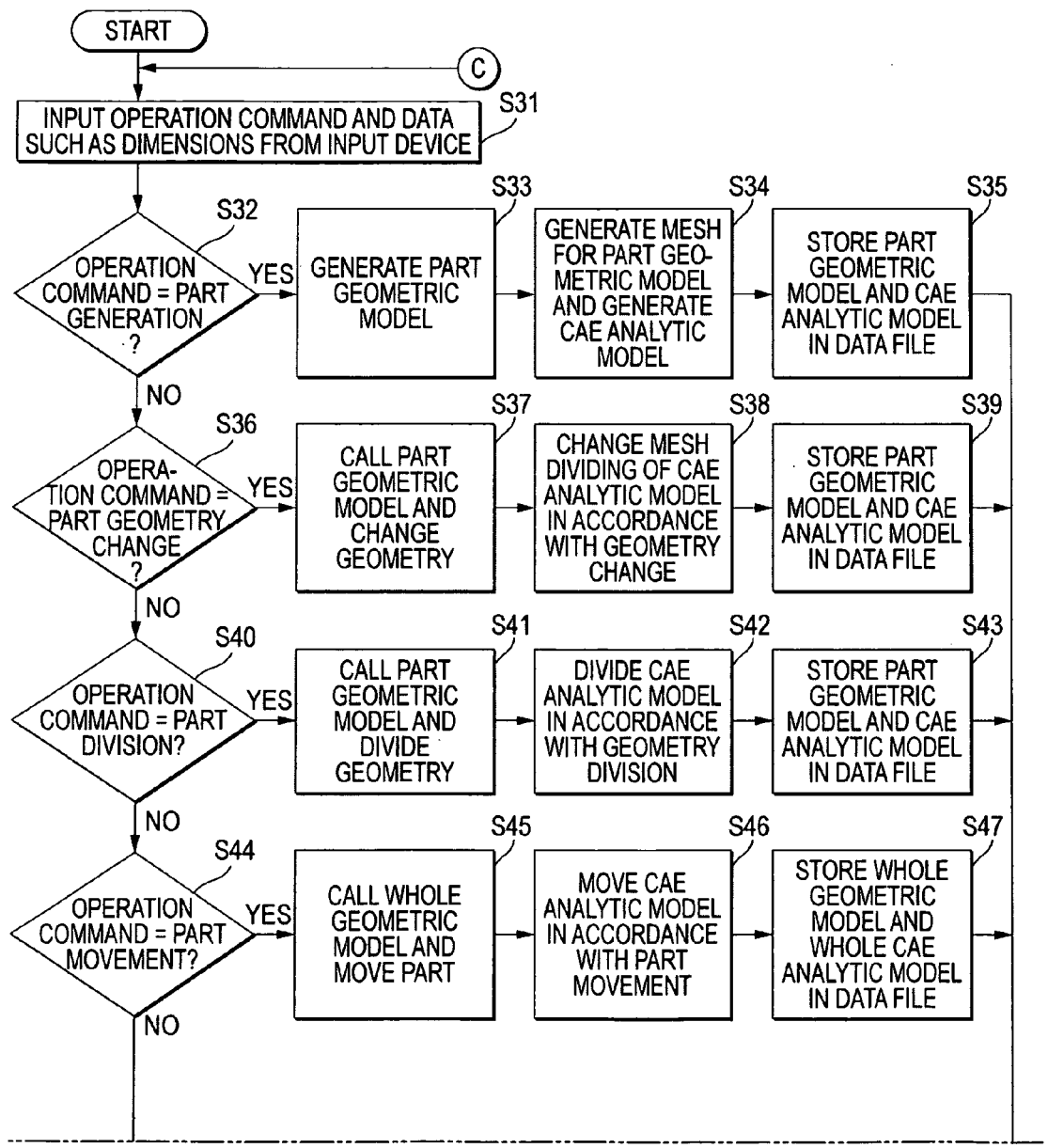
FIG. 2 is an exemplary flow chart for explaining a part of operation of the design/verification aid system depicted in FIG. 1.
Figure 3:
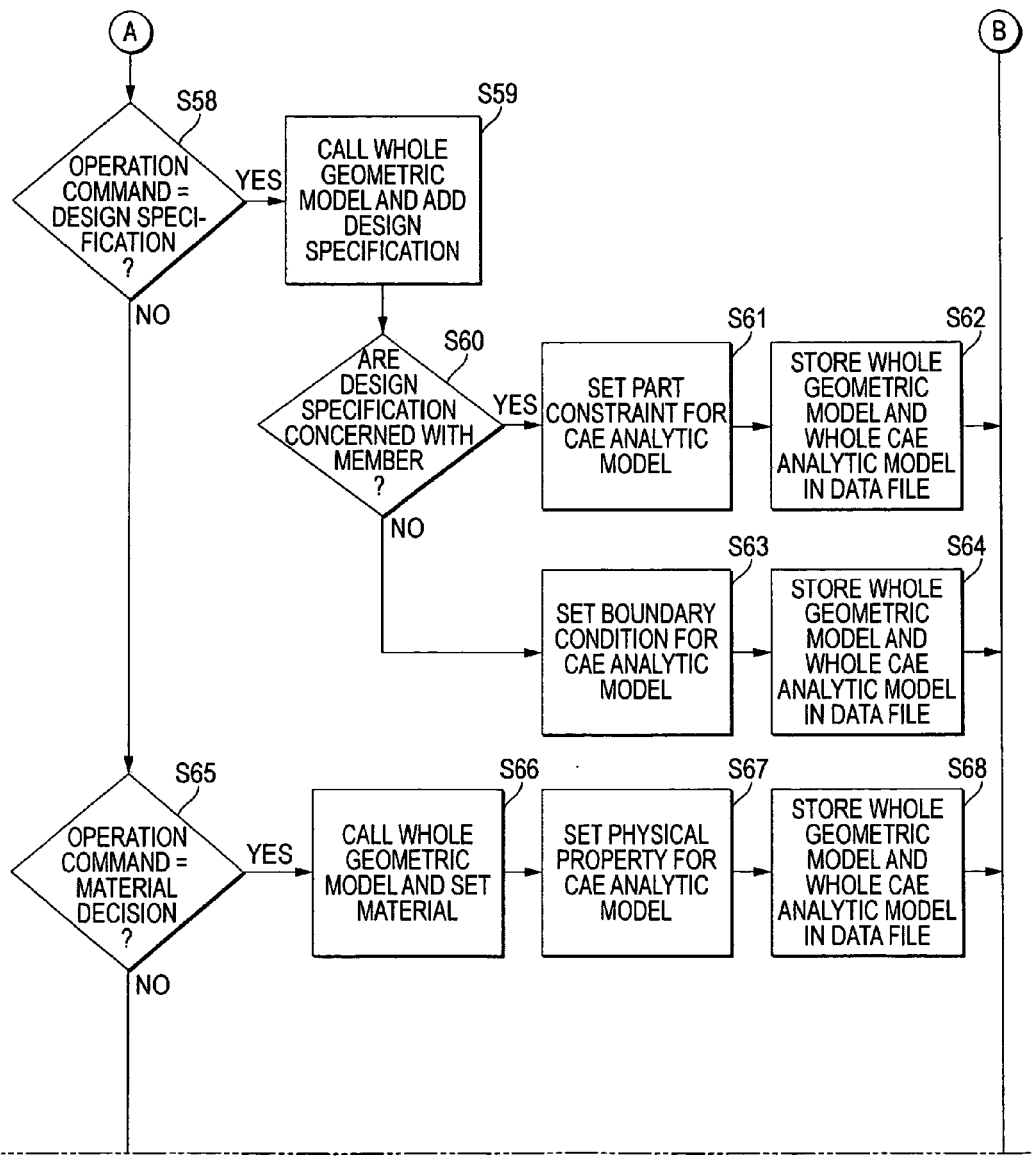
FIG. 3 is an exemplary flow chart for explaining the remaining part of the operation of the design/verification aid system depicted in FIG. 1.

Next, the operation of the design/verification aid system will be described with reference to flow charts of FIGS. 2 and 3.

First, an operator inputs an operation command and data such as dimensions to the system body 22 through the input device 21 on the basis of design specifications and a design blueprint (Step S31). The operation command processing judgment section 39 of the system body 22 judges the kind of the input operation command. The input operation command is sent to a processing section corresponding to the operation command.

When the input operation command is an operation command concerned with "part generation" (YES in Step S32), the geometric model generation section 24 generates a geometric model of a part on the basis of the data such as dimensions (Step S33). The mesh dividing section 28 generates an analytic model (CAE analytic model) corresponding to the generated part geometric model (Step S34). In Step S34, a mesh dividing process is performed on the generated part geometric model as shown in FIG. 5A, so that the analytic model corresponding to the part geometric model is generated. The analytic model generation process is executed automatically in the background. The part geometric model and the CAE analytic model generated thus are stored in the data file storage section 23 (Step S35).

When the input operation command is an operation command concerned with "part geometry change" (YES in Step S36), the geometric model generation section 24 calls a corresponding part geometric model from the data file storage section 23 and changes the geometry of the part geometric model (Step S37). The mesh dividing change section 29 calls a CAE analytic model corresponding to the changed part geometric model from the data file storage section 23 and changes the mesh geometry of the CAE analytic model in accordance with the change of the part geometric model (Step S38). In Step S37, processes for adding a part geometry and forming a hole in the part geometric model are performed as shown in FIG. 5B. In Step S38, the mesh geometry of the CAE analytic model is changed in accordance with the geometry change process performed in Step 37. The process for changing the mesh geometry of the CAE analytic model is performed automatically in the background. The changed part geometric model and the changed CAE analytic model are stored in the data file storage section 23 (Step S39).

When the input operation command is an operation command concerned with "part division" (YES in Step S40), the geometric model generation section 24 calls a corresponding part geometric model from the data file storage section 23, divides the part geometric model into pieces and generates parts (Step S41). The part division processing section 30 calls a CAE analytic model corresponding to the divided part geometric model from the data file storage section 23 and divides the CAE analytic model into pieces in accordance with the same division positions as the division positions of the part geometric model (Step S42). The CAE analytic model division process is executed automatically in the background. The respective part geometric models obtained by the division and the respective CAE analytic models obtained by the division are stored in the data file storage section 23 (Step S43).

When the input operation command is an operation command concerned with "part movement" (YES in Step S44), the whole model construction section 25 calls a whole geometric model corresponding to the whole of a product under design from the data file storage section 23, and moves the position of a part geometric model corresponding to a predetermined part within the whole geometric model (Step S45). The part position movement processing section 31 calls a whole CAE analytic model corresponding to the whole geometric model from the data file storage section 23, edits the whole CAE analytic model, and moves the position of a CAE analytic model corresponding to the moved part geometric model within the whole CAE analytic model (Step S46). The process in Step S46 is executed automatically in the background. The whole geometric model subjected to the part movement and the whole CAE analytic model subjected to the part movement are stored in the data file storage section 23 (Step S47).

When the input operation command is an operation command concerned with "part addition" (YES in Step S48), the whole model construction section 25 calls a whole geometric model to be processed (or a part geometric model to be processed) from the data file storage section 23, adds a part geometric model which corresponds to another part and which is called from the data file storage section 23, to the whole geometric model (or the part geometric model), and generates a new whole geometric model (Step S49). In this case, the whole model construction section 25 performs a process for inputting part relation information for designating a part relation between the whole geometric model (or the part geometric model) and the part geometric model corresponding to the other part (Step S50). In Step S50, in response to a message displayed on the display device for urging a user to input the part relation information, the user operates the input device 21 to input the part relation information. The part addition processing section 32 calls a whole CAE analytic model corresponding to the whole geometric model to be processed (or a CAE analytic model corresponding to the part geometric model to be processed) from the data file storage section 23, and edits the whole CAE analytic model (or the CAE analytic model) in accordance with the contents of the addition process in Step S49. In this case, the part addition processing section 32 executes a process for adding an inter-part connection element corresponding to the designated part relation to the whole analytic model (or the CAE analytic model) on the basis of the inputted part relation information (Step S51). The inter-part connection element is an element (e.g. a joint, a spring, a damper, a lumped element, a contact element, a slide element, etc.) used in CAE analysis. The process in Step S51 is executed automatically in the background.

In Step S49, for example, a process for attaching parts such as a shaft, a fan, etc. to the whole geometric model is performed as shown in FIG. 5C. In this case, for example, attribute information "vertically movable" is inputted as the part relation information for indicating a part relation between the whole geometric model and the shaft. Moreover, for example, attribute information "vibration source" is inputted as the part relation information for indicating a part relation between the whole geometric model and the fan. For example, the part addition processing section 32 executes a process for adding a slide element between a base and the shaft on the basis of the attribute information "vertically movable", and a process for replacing the fan with a vibration source and adding the vibration source to the whole geometric model on the basis of the attribute information "vibration source".

The whole geometric model subjected to the part addition and the whole CAE analytic model subjected to the part addition are stored in the data file storage section 23 (Step S52).

When the input operation command is an operation command concerned with "part operation" (YES in Step S53), the whole model construction section 25 calls a whole geometric model to be processed from the data file storage section 23, and adds operation information inputted from the input device 21 to a designated part in the whole geometric model (Step S54). The part operation processing section 33 calls a whole CAE analytic model from the data file storage section 23, and checks whether the operation information about the designated part has already been present in the whole CAE analytic model or not (Step S55). When the operation information is not present, the part operation processing section 33 adds the operation information (e.g. functional equation, operation range, and acceleration pattern) as CAE analysis conditions to the corresponding part in the whole CAE analytic model (Step S56). The processes in Steps S55 and S56 are executed in the background. The whole geometric model given the operation information and the whole CAE analytic model given the operation information are stored in the data file storage section 23 (Step S57).

When the input operation command is an operation command concerned with "design specifications" (YES in Step S58), the design specification attribute data input section 26 calls a whole geometric model from the data file storage section 23, and sets design specifications inputted from the input device 21 for the whole geometric model (Step S59). The boundary condition processing section 34 judges whether the set design specifications are concerned with a member or not (Step S60).

When the set design specifications are design specifications concerned with a member (YES in Step S60), the boundary condition processing section 34 calls a whole CAE analytic model from the data file storage section 23, and sets part constraints (e.g. maximum allowable weight, maximum allowable dimensions, and minimum allowable area) corresponding to the design specifications as CAE analysis conditions for the whole CAE analytic model (Step S61). The whole geometric model set with the design specifications and the whole CAE analytic model set with the part constraints are stored in the data file storage section 23 (Step S62).

When the set design specifications are not design specifications concerned with a member (NO in Step S60), the boundary condition processing section 34 calls the whole CAE analytic model from the data file storage section 23, and sets boundary conditions corresponding to the design specifications as CAE analysis conditions for the whole CAE analytic model (Step S63). When design specifications "not broken in spite of drop from 5 m" and "shaft load of 5 ton" are given in Step S63, for example, as shown in FIG. 5D, the boundary condition processing section 34 replaces the design specifications with a contact function and an acceleration load and sets the contact function and the acceleration load as boundary conditions for the whole CAE analytic model automatically. The whole geometric model set with the design specifications and the whole CAE analytic model set with the boundary conditions are stored in the data file storage section 23 (Step S64).

The processes in Step S61 and Step S63 are executed in the background.

When the input operation command is an operation command concerned with "material decision" (YES in Step S65), the design specification attribute data input section 26 calls a whole geometric model from the data file storage section 23, and sets a material inputted from the input device 21 for a corresponding part of the whole geometric model (Step S66). The physical property processing section 35 calls a whole CAE analytic model from the data file storage section 23 and sets physical properties corresponding to the material as CAE analysis conditions for the corresponding part of the whole CAE analytic model (Step S67). The process in Step S67 is executed in the background. The whole geometric model set with the material and the whole CAE analytic model set with the physical properties are stored in the data file storage section 23 (Step S68).

When the input operation command is an operation command concerned with "consistency judgment" (YES in Step S69), the design logic judgment processing section 36 calls a whole geometric model and a whole CAE analytic model from the data file storage section 23 (Step S70), and performs a process for checking consistency between the whole geometric model and the whole CAE analytic model (Step S71). In Step S71, the design logic judgment processing section 36 judges whether the consistency is satisfied or not, that is, whether all the analysis conditions (e.g. element, physical properties, boundary conditions, loads, operations, etc.) necessary for analysis of the whole geometric model have been set for the whole CAE analytic model or not. When there comes short of any condition, the design logic judgment processing section 36 inputs a default value or urges the operator to input information. When the consistency is satisfied, the design logic judgment processing section 36 stores the whole geometric model and the whole CAE analytic model in the data file storage section 23 (Step S72).

When the input operation command is an operation command concerned with "analysis execution" (YES in Step S73), the analysis execution section 27 calls a whole CAE analytic model from the data file storage section 23 (Step S74), and analyzes the whole CAE analytic model (Step S75). In Step S75, the analysis execution section 27 executes an analysis process such as rigidity analysis, vibration analysis, or drop impact analysis on the whole geometric model under design on the basis of the whole CAE analytic model. The analysis execution section 27 may execute some kinds of analysis collectively or may automatically decide the kind of analysis to be executed from the contents of the inputted design specifications. After execution of the analysis process, the analysis execution section 27 stores the whole CAE analytic model and a result of the analysis in the data file storage section 23 (Step S76).

Figure 4A:
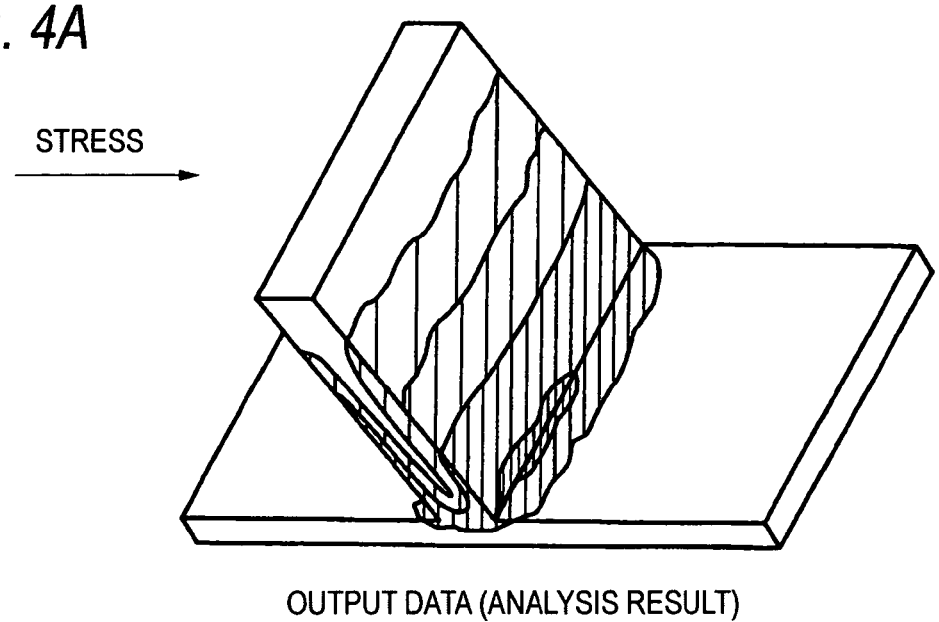
FIGS. 4A and 4B are exemplary views showing examples of output data of the design/verification aid system depicted in FIG. 1.
Figure 4B:
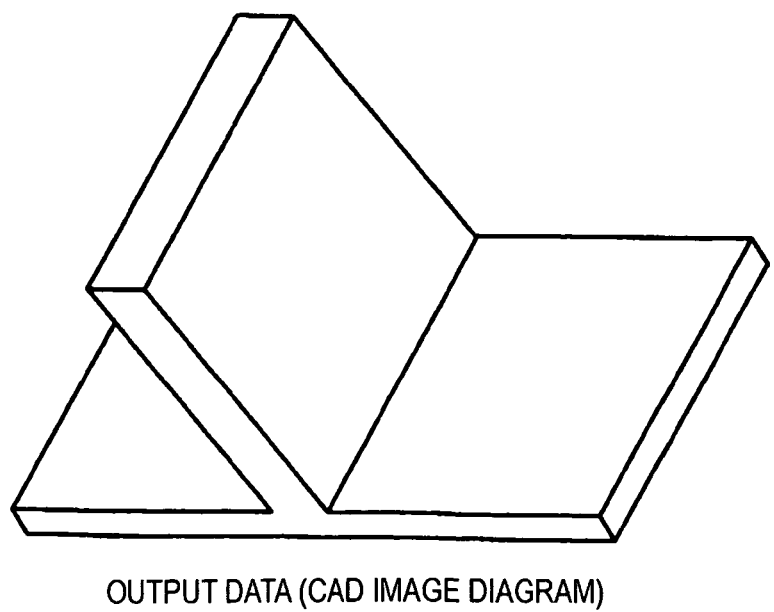

When the input operation command is an operation command concerned with "result output" (YES in Step S77), the CAD/analysis result processing section 37 calls an analysis result of a whole CAE analytic model from the data file storage section 23 (Step S78), and displays the analysis result as shown in FIG. 4A and a CAD image (the whole geometric model) as shown in FIG. 4B on the display device 38 (Step S79). FIG. 4A shows an analysis result concerned with stress distribution in the case where force is applied to a designed product in the direction of an illustrated arrow.

The processes in Steps S31 to S79 are executed selectively in accordance with the kind of the input operation command until the design/verification operation is completed (NO in Step S80).

As described above, in the design/verification aid system according to the embodiment, CAE analytic model generation and edition processes are performed in response to operation commands for CAD processes such as part generation, part geometry change, part division, part movement, part addition, etc. In this manner, generation and edition of the CAE analytic model are executed automatically in the background in accordance with design progress in the CAD processes. With this configuration, a necessary analysis process can be executed immediately in any design stage at any time and design verification can be executed efficiently because the CAE analytic model corresponding to the current design contents is always present. Moreover, since final design can be verified simultaneously with completion of the design, quality of the design can be improved.

Moreover, since boundary conditions, part constraints, etc. can be set automatically on the basis of input design specifications, load imposed on the operation can be lightened greatly. In addition, since inputted part relation information is automatically replaced by an inter-part connection element for CAE analysis, analysis can be performed in consideration of the part relation.

Incidentally, since all functions of the design/verification aid system according to the embodiment can be implemented by a computer program, an effect the same as the effect of the embodiment can be achieved easily when the computer program is installed in an ordinary computer through a computer-readable storage medium.

Moreover, the invention is not limited to the embodiment and can be embodied by modifying the constituent elements in a practical stage without departing from the gist of the invention. In addition, suitable combination of constituent elements disclosed in the embodiment can form various inventions. For example, some constituent elements can be removed from the whole constituent elements disclosed in the embodiment. Moreover, constituent element in different embodiments may be combined suitably.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A design/verification aid system adapted to aid design of a product and verification of the design, comprising:
a design processing unit that executes a CAD (computer aided design) process in accordance with an input operation command, the CAD process including:

a part generation process to generate a part geometric model, a part addition process to add to the generated part geometric model a part geometric model corresponding to another part to generate a whole geometric model corresponding to a product under design, the whole geometric model including the generated part geometric model, a process to designate a part relation between the generated part geometric model and the part geometric model corresponding to another part based on inputted part relation information, the inputted part relation information includes an attribute information indicating a vibration source, and a part movement process to move a position of a predetermined part geometric model in the whole geometric model;

an analytic model generation unit that, when the part geometric model is generated by the part generation process, generates an analytic model corresponding to the part geometric model;

an analytic model edition unit that edits the generated analytic model in accordance with a content of either (i) the part addition process when the part addition process is executed, or (ii) the part movement process when the part movement process is executed, and generates a whole analytic model corresponding to the whole geometric model; and an analysis unit that executes an analysis process to analyze the whole geometric model on a basis of the whole analytic model generated by the analytic model edition unit, and displays an analytic result.

2. The design/verification aid system according to claim 1, further comprising:

an input unit that inputs information to designate a design specification of the whole geometric model; and a unit that sets a boundary condition corresponding to the design specification for the whole analytic model on a basis of the inputted information, wherein the analysis unit includes a unit that executes the analysis process on a basis of the whole analytic model and the set boundary condition.

3. The design/verification aid system according to claim 1, wherein the design processing unit includes a unit for inputting the part relation information, and the analytic model edition unit includes a unit that adds an inter-part connection element corresponding to a part relation to the whole analytic model on the basis of the inputted part relation information.

4. The design/verification aid system according to claim 1, wherein the analytic model edition unit includes a unit that generates the whole analytic model in response to an input operation command corresponding to each of the part addition process and the part movement process.

5. A design/verification aid method for aiding design of a product and verification of the design by a computer, comprising:

executing a CAD (computer aided design) process in accordance with an input operation command, the CAD process including:

a part generation process to generate a part geometric model, a part addition process to add to the generated part geometric model a part geometric model corresponding to another part to generate a whole geometric model corresponding to a product under design, the whole geometric model including the generated part geometric model, and a part movement process to move a position of a predetermined part geometric model in the whole geometric model;

generating, when a part geometric model is generated by the part generation process, an analytic model corresponding to the part geometric model;

editing the generated analytic model in accordance with a content from either the part addition process whenever the part addition process is executed, or the part movement process, when the part movement process is executed, and generating a whole analytic model corresponding to the whole geometric model;

adding an inter-part connection element corresponding to a part relation to the whole analytic model on the basis of part relation information inputted from an input device of the computer to designate a part relation between the generated part geometric model and the part geometric model corresponding to another part, the inputted part relation information includes an attribute information indicating a vibration source; and executing an analysis process to analyze the whole geometric model on a basis of the generated whole analytic model, and displaying an analytic result on a display device of the computer.

6. The design/verification aiding method according to claim 5, further comprising:

setting a boundary condition corresponding to the design specification for the whole analytic model on a basis of information inputted from an input device of the computer to designate a design specification of the whole geometric model, wherein the analyzing the whole geometric model includes executing the analysis process on a basis of the whole analytic model and the set boundary condition.

7. A computer program product for enabling a computer to aid design of a product and verification of the design, comprising:

software instructions for enabling the computer to perform predetermined operations; and a computer readable medium bearing the software instructions, the predetermined operations including:

executing a CAD (computer aided design) process in accordance with an input operation command, the CAD process including:

a part generation process to generate a part geometric model, a part addition process to add to the generated part geometric model a part geometric model corresponding to another part to generate a whole geometric model corresponding to a product under design, the whole geometric model including the generated part geometric model, and a part movement process to move a position of a predetermined part geometric model in the whole geometric model;

generating, when a part geometric model is generated by the part generation process, an analytic model corresponding to the part geometric model;

editing the generated analytic model in accordance with a content of the part addition process when the part addition process is executed, and a content of the part movement process when the part movement process is executed, and generating a whole analytic model corresponding to the whole geometric model;

adding an inter-part connection element corresponding to a part relation to the whole analytic model on the basis of part relation information inputted from an input device of the computer to designate a part relation between the generated part geometric model and the part geometric model corresponding to another part, the inputted part relation information includes an attribute information indicating a vibration source; and executing an analysis process to analyze the whole geometric model on a basis of the generated whole analytic model, and displaying an analytic result on a display device of the computer.

8. The computer program product according to claim 7, the predetermined operations further including:

setting a boundary condition corresponding to the design specification for the whole analytic model on a basis of information inputted from an input device of the computer to designate a design specification of the whole geometric model, wherein the analyzing the whole geometric model includes executing the analysis process on a basis of the whole analytic model and the set boundary condition.

\* \* \* \* \*